US006934136B2

(12) United States Patent
Duvvury

(10) Patent No.: US 6,934,136 B2
(45) Date of Patent: Aug. 23, 2005

(54) ESD PROTECTION OF NOISE DECOUPLING CAPACITORS

(75) Inventor: Charvaka Duvvury, Plano, TX (US)

(73) Assignee: Texas Instrument Incorporated, Dallas, TX (US)

( * ) Notice: Subject to any disclaimer, the term of this patent is extended or adjusted under 35 U.S.C. 154(b) by 453 days.

(21) Appl. No.: 10/128,908

(22) Filed: Apr. 24, 2002

(65) Prior Publication Data

US 2003/0202311 A1 Oct. 30, 2003

(51) Int. Cl.$^{7}$ .................................................. H02H 9/00

(52) U.S. Cl. ........................... 361/56; 361/58; 361/111; 361/118

(58) Field of Search ............................. 361/18, 56, 58, 361/111, 113, 117, 118, 120, 127, 78, 91.1

(56) References Cited

U.S. PATENT DOCUMENTS 5,955,763 A * 9/1999 Lin ............................ 257/355
6,501,136 B1 * 12/2002 Lin ............................ 257/355
6,538,300 B1 * 3/2003 Goldberger et al. ........ 257/532
6,661,273 B1 * 12/2003 Lai et al. .................... 327/310

* cited by examiner

*Primary Examiner*—Stephen W. Jackson
(74) *Attorney, Agent, or Firm*—W. James Brady, III; Frederick J. Telecky, Jr.

(57) ABSTRACT

Electrostatic discharge protection devices formed at a face of a semiconductor substrate, integrated with a component sensitive to electrostatic discharge, wherein the protection device is interdigitated with the component.

The invention is applicable to many kinds of components, for example to a noise-decoupling capacitor shaped as an nMOS transistor with thin dielectric, or to an input buffer shaped as an nMOS transistor, or to an antenna shaped as an nMOS transistor. The protection device includes an nMOS transistor. The insulator of the gates, preferably silicon dioxide, is thin and in need of protection against ESD damage.

The interdigitation may be configured in one or more planes. Further, the protection device may lie in a single plane spaced apart from the plane defined by the components. The protection device may also partially be merged with the component.

16 Claims, 6 Drawing Sheets

ESD PROTECTION OF NOISE DECOUPLING CAPACITORS

FIELD OF THE INVENTION

The present invention is related in general to the field of electronic systems and semiconductor devices and more specifically to the field of electrostatic discharge (ESD) protection of noise-decoupling capacitors and input buffers in deep submicron CMOS technologies.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Input protection circuits in known technology typically provide two-stage input protection to isolate internal circuits from high voltage transients at an external terminal or bond pad. The prior art circuit of FIG. 1 comprises a primary clamp 102 coupled to external terminal 116. Resistor 104 couples the primary clamp 102 to secondary clamps 106 and 108 and to the control gates of input transistors 110 and 112. The primary and secondary clamps may be any combination of silicon-controlled rectifiers, transistors, diodes, or Zener diodes as is well known in the art. Secondary clamps 106 and 108 preferably conduct at a lower voltage than primary clamp 102, thereby isolating internal circuits from potentially destructive voltage levels. In operation, an ESD voltage at external terminal 116 produces a voltage increase at internal terminal 118. This voltage increase activates one of secondary clamps 306 and 308. The activated secondary clamp conducts ESD current, thereby clamping the voltage at terminal 118. This clamped voltage at terminal 118 prevents rupture of the gate oxide of input transistors 110 and 112 and produces a voltage drop across resistor 104. The ESD voltage at external terminal 116 continues to rise until primary clamp 102 is activated. Primary clamp 102 then conducts a majority of the ESD current for the duration of the ESD event.

Normal operation of the circuit of FIG. 1, however, is compromised by resistor 104 and the capacitance of secondary clamps 106 and 108 and input transistors 110 and 112. Resistor 104 typically has a value between 50 and 100 Ω. Secondary clamps 106 and 108 and input transistors 110 and 112 typically have a capacitance of 2 pF. A signal transition at external terminal 116, therefore is delayed at internal terminal 118 by a 200 ps time constant. This delay imposes a significant limitation on high frequency circuit performance. A complete signal transition at internal terminal 118, for example, may be delayed by three time constants or 600 ps from the corresponding transition at external terminal 116. This delay may compromise more than 10% of total access time for high-speed ICs.

A solution for minimizing input resistance 104 in FIG. 1 (and thus reducing input delay) has been described in U.S. Pat. No. 6,137,338, issued on Oct. 24, 2000 (Marum et al., "Low Resistance Input Protection Circuit"). The solution is summarized in FIG. 2. An input circuit is designed with an external terminal 204. A first input transistor 208 has a control gate coupled to the external terminal by a low resistance path 204. The first input transistor has a current path coupled to an output terminal 220. A first series transistor 210 has a control gate and a current path. The current path of the first series transistor is connected in series with the current path of the first input transistor. A primary clamp 202 is coupled to the external terminal, and there is no need for a secondary clamp.

The solution of U.S. Pat. No. 6,137,338 puts a burden on the circuit layout designers due to the complexity of the proposed design. A much simpler solution is desirable. Likewise, noise-decoupling capacitors are often found to be very sensitive for ESD, especially with the advanced ultra-thin gate oxide. An urgent need has, therefore, arisen for a coherent, low-cost method of minimizing input resistance and enhancing ESD insensitivity without the need for additional, real-estate consuming protection devices. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

The present invention describes electrostatic discharge protection devices formed at a face of a semiconductor substrate, integrated with a component sensitive to electrostatic discharge, wherein the protection device is interdigitated with the component.

The invention is applicable to many kinds of components. In the first, second and third embodiments of the invention, the component is a noise-decoupling capacitor shaped as an nMOS transistor with thin dielectric, and in the fourth embodiment, the component is an input buffer shaped as an nMOS transistor. The protection device includes an nMOS transistor. The insulator of the gates, preferably silicon dioxide, is thin (thickness range 1 to 10 nm) and in need of protection against ESD damage.

The interdigitation may be configured in one or more planes. Further, the protection device may lie in a single plane spaced apart from the plane defined by the components. The protection device may also partially be merged with the component.

It is a technical advantage of the invention that in designing the interdigitated layout of component transistor and protection transistor, the nMOS component gates and the nMOS protection gates can be varied in any sequence or proportion.

Another advantage of the invention is that all considerations hold also for circuit designs using pMOS transistors by simply inverting polarities and doping types.

In the fourth embodiment where the component is an input buffer, the invention provides ESD protection without the need of a resistor coupling the ESD protection scheme and the input transistor. The invention, thus, provides a low-cost solution for high-speed buffer and circuit operation.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 6,137,338, issued on Oct. 24, 2000 (Marum et al., "Low Resistance Input Protection Circuit"), and U.S. Patent Application No. 60/318,046, filed on Sep. 7, 2001 (Duvvury et al., "Output Buffer and I/O Protection Circuit for CMOS Technology").

The first embodiment of the present invention concerns itself with noise decoupling capacitors on power pads of integrated circuits (ICs), which are essential parts of advanced IC designs. Usually, these capacitors are built with thin silicon dioxide insulators (about 1 to 10 nm thick) and hence can be prone to damage by any kind of external electrostatic discharge (ESD) event. A fast pulse event can damage thin gate oxides, especially when the oxide thickness is not uniform across the large capacitor. The solution described by the present invention is proper integration of the ESD protection device with the large capacitor.

Figure 1:
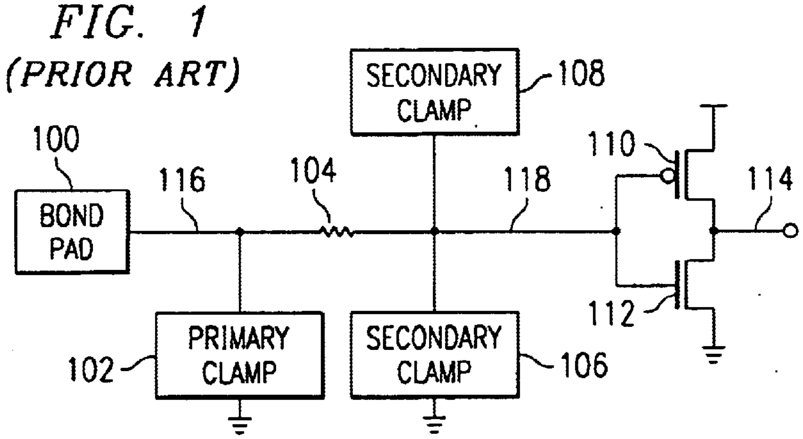
FIG. 1 is a schematic diagram of an input circuit of the prior art, illustrating the resistor needed for coupling ESD protection schemes and input transistors, where the resistor compromises high speed circuit operation.
Figure 2:
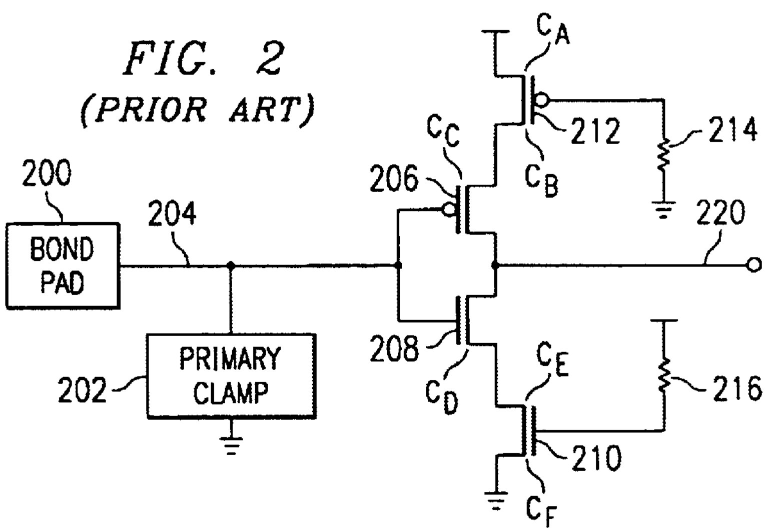
FIG. 2 is a schematic diagram of another input circuit of the prior art, illustrating the avoidance of a speed-compromising resistor, but exhibiting space-sacrificing constraints on circuit designers.
Figure 3:
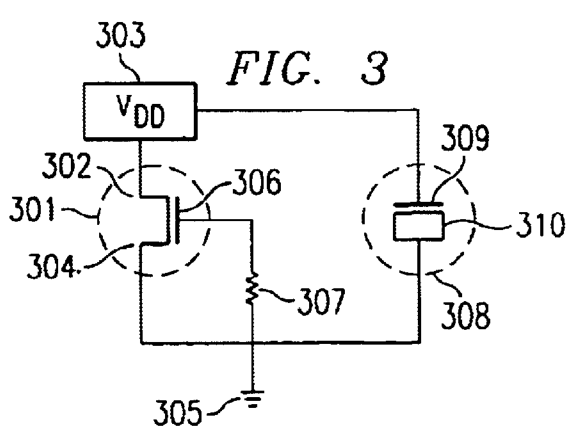
FIG. 3 is a schematic diagram of a noise-decoupling capacitor on a power pad of an integrated circuit, combined with an ESD protection transistor.

In the schematic circuit diagram of FIG. 3, the ESD protection device 301 is depicted as an nMOS transistor, its drain 302 connected to a power pad 303 and its source 304 connected to ground potential 305. The gate 306 of the protection transistor is connected to ground potential 305 through a resistor 307. FIG. 3 further shows the component sensitive to ESD, namely a noise-decoupling MOS capacitor 308, which has a thin insulator, for example a thin oxide layer. One capacitor terminal 309 is connected to pad 303, the other terminal is connected to ground potential 305.

Figure 4A:
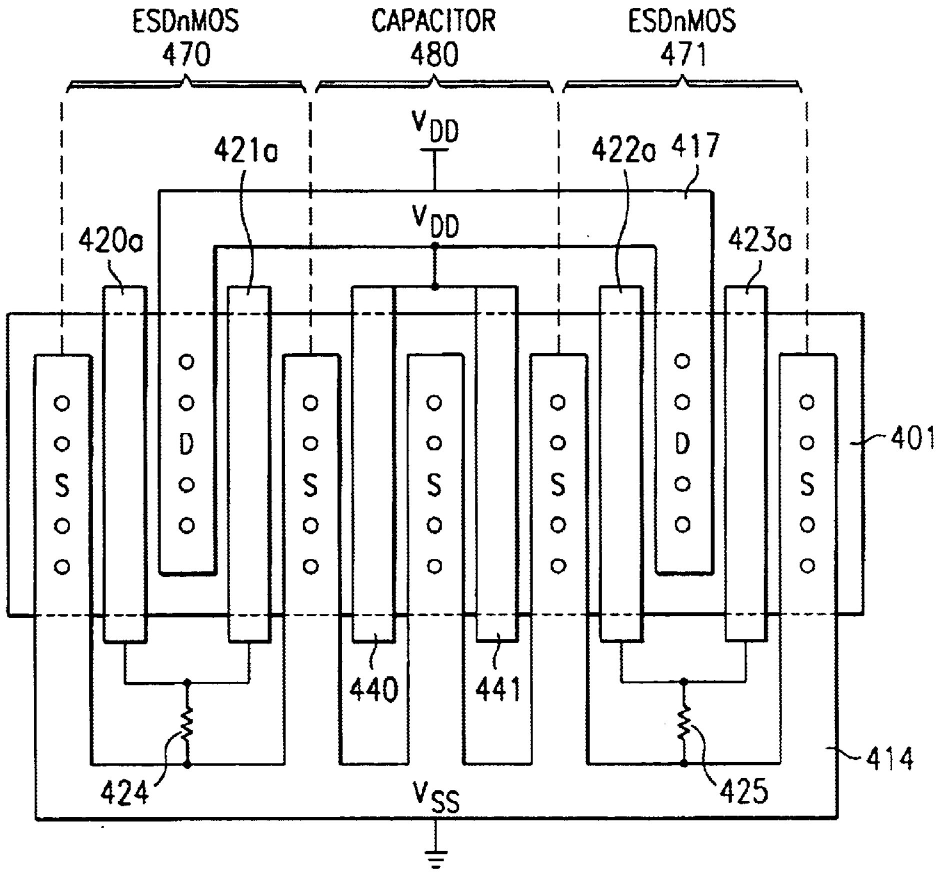
FIG. 4A shows a simplified top view of a noise-decoupling capacitor formed as an nMOS transistor interdigitated with an ESD protection transistor in the face of an IC substrate, according to the first embodiment of the invention.
Figure 4B:
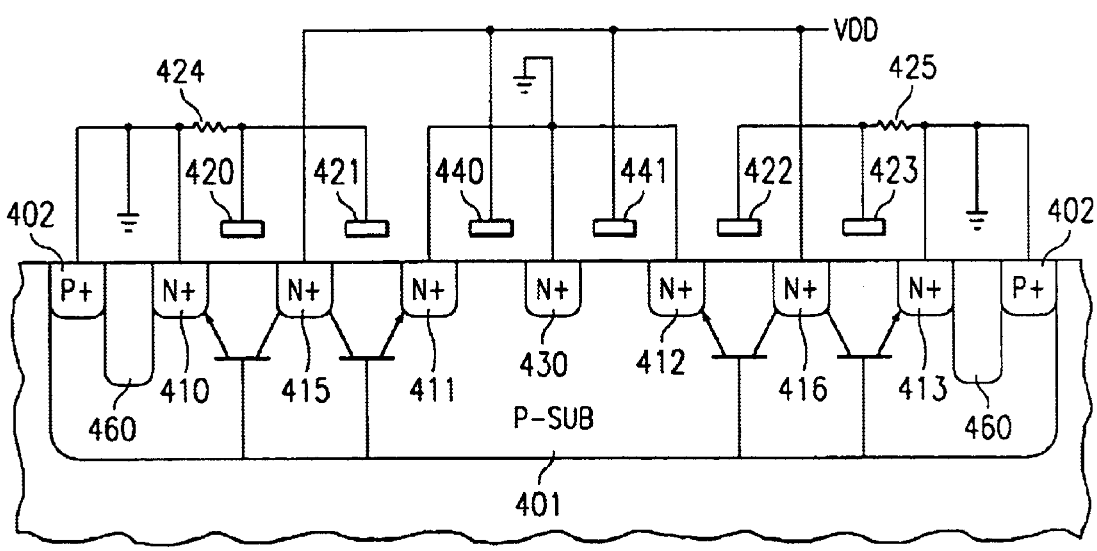
FIG. 4B shows a simplified cross section of a noise-decoupling capacitor formed as an nMOS transistor interdigitated with an ESD protection transistor in the face of an IC substrate, according to the first embodiment of the invention.

The concept of the present invention is schematically illustrated in the top view of FIG. 4A and the corresponding cross section of FIG. 4B. The ESD protection device is integrated with the ESD-sensitive component to be protected, wherein the integration is provided by interdigitated configuration, with partial merging, of the components.

In FIG. 4B, a portion of the semiconductor substrate is shown as p-well or p-sub 401; the confines of this region are determined by the shallow trench isolations 460, as indicated in FIG. 4B. The p-well has contact regions p+, designated 402 in FIG. 4B, which are connected to ground potential. A plurality of n+-p-n+ nMOS transistors and n+-p-n+ structures used as capacitors are formed in the region between the trench isolations 460.

The n+ regions 410, 411, 412, and 413, indicated in the cross section of FIG. 4B, serve as sources of the nMOS transistors of the ESD protection device. These n+ regions have strongly elongated shape suitable for interdigitated arrangements, and are interconnected by metallization 414 (in FIG. 4A). As Vss, this metallization 414 is connected to ground potential.

The n+ regions 415 and 416 in FIG. 4B serve as drains of the ESD nMOS transistors. These n+ regions, too, have strongly elongated shape suitable for interdigitated arrangements, and are interconnected by metallization 417 (in FIG. 4A). As Vdd, this metallization 417 is connected to the power pad.

The polysilicon gates 420, 421, 422, and 423 form the gates of the ESD nMOS transistors. These gates, too, have strongly elongated shape suitable for interdigitated arrangements. These gates are shown as poly areas 420*a*, 421*a*, 422*a*, and 423*a* in FIG. 4A; they are connected to ground potential through resistors 424 and 425.

It is pivotally important for the present invention that the large noise-decoupling capacitor with its ESD-sensitive insulator is formed as an nMOS transistor. In FIG. 4B, this transistor has its n+-regions 411, 412, and 430 as source and drain shorted to ground potential and its gates 440 and 441 tied to the power pad Vdd. As can be seen in FIGS. 4A and 4B, this capacitor nMOS is also designed in elongated shape, suitable for interdigitated arrangements.

As the first embodiment of the present invention, the integration of the capacitor with the protection transistor is summarized in FIG. 4A. The arrangements of the protection transistor are indicated by regions 470 and 471, while the arrangement of the capacitor, interdigitated with the protection transistor, is indicated by region 480. Provided by this integration, the thin capacitor insulator is protected against ESD damage.

Figure 5:
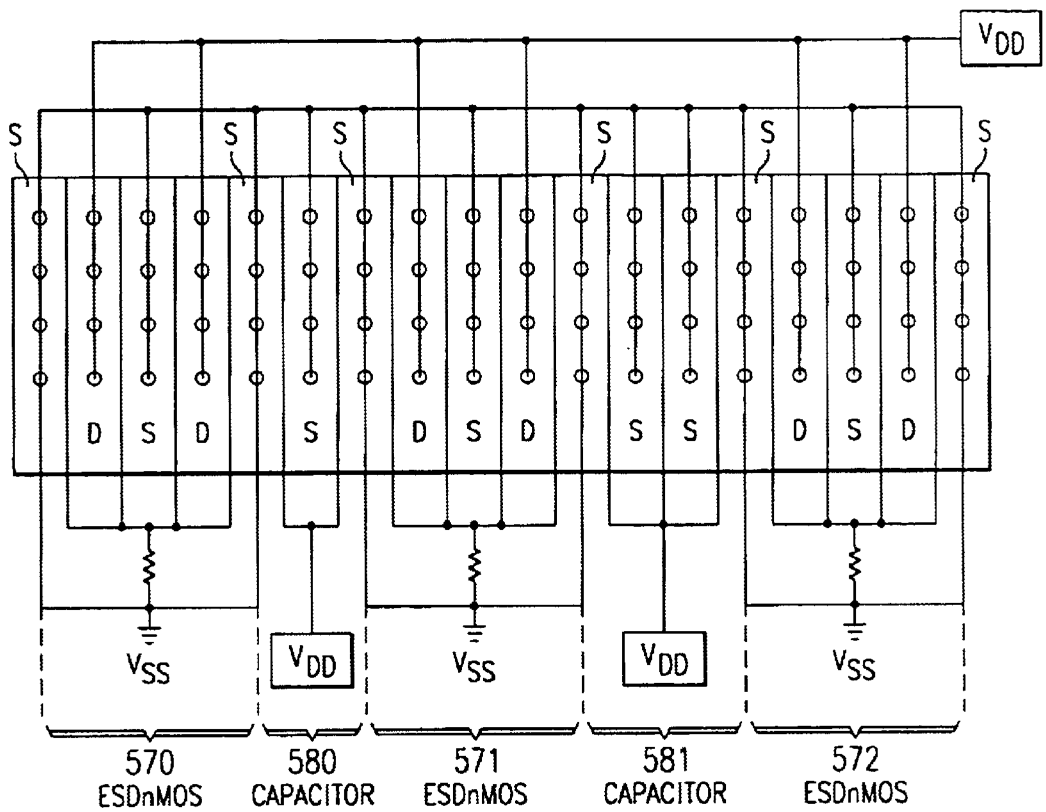
FIG. 5 shows a simplified top view of another noise-decoupling capacitor formed as an nMOS transistor interdigitated with an ESD protection transistor in the face of an IC substrate, according to the first embodiment of the invention.

The capacitor gates and the protection nMOS gates can be varied in any sequence or proportion. The schematic top view of FIG. 5 illustrates a more extensive progression than the portion in FIGS. 4A and 4B of a noise-decoupling capacitor formed as an nMOS transistor and of an ESD protection nMOS transistor, integrated according to the first embodiment of the invention. The arrangements of the ESD protection nMOS transistors are indicated by regions 570, 571, and 572. The arrangements of the large capacitor, formed as an nMOS transistor and interdigitated with the protection nMOS transistors, are indicated by 580 and 581. The elongated geometries and the electrical connections are equivalent to the interconnections in FIGS. 4A and 4B.

It should be stressed that analogous considerations hold for an n-well substrate and pMOS transistors; the doping types and the electrical connotations are reversed.

Figure 6:
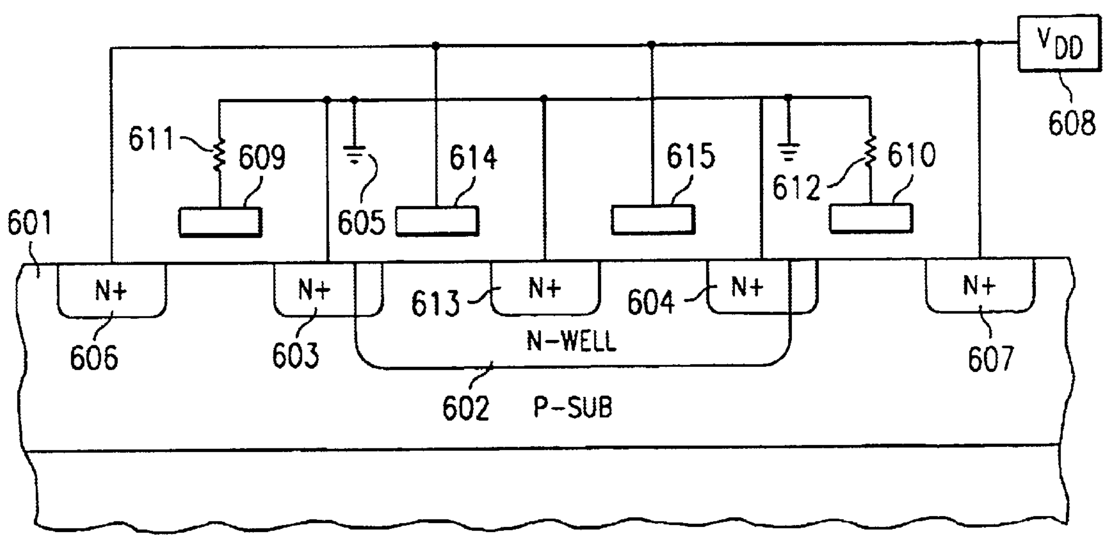
FIG. 6 shows a simplified cross section of another noise-decoupling capacitor formed as an nMOS transistor interdigitated with an ESD protection transistor in the face of an IC substrate, according to the second embodiment of the invention.

The same method can be used when the capacitor is to be built in an n-well. The schematic cross section of FIG. 6 illustrates the second embodiment of the invention. The p-substrate or p-well 601 contains the n-well 602. The n+ regions 603 and 604, partially located in the p-substrate, serve as sources of the protection nMOS transistor and are connected to ground potential 605. The n+-regions 606 and 607, located in the p-substrate, serve as drains of the protection transistor and are connected to Vdd (pad) 608. The gates 609 and 610 of the protection transistors are connected to ground potential 605 through resistors 611 and 612, respectively.

The noise-decoupling thin insulator capacitor-to-be-protected, located in the n-well, is formed as an MOS transistor, with partially shared n+ regions 603 and 604 and n+-region 613, all connected directly to ground potential. The gates 614 and 615 are connected to Vdd (pad) 608. By designing the protection transistor and the capacitor in elongated geometries, their components can easily be interdigitated, whereby the capacitor is integrated with the protection transistor and the thin insulator of the capacitor is protected against ESD damage.

Figure 7:
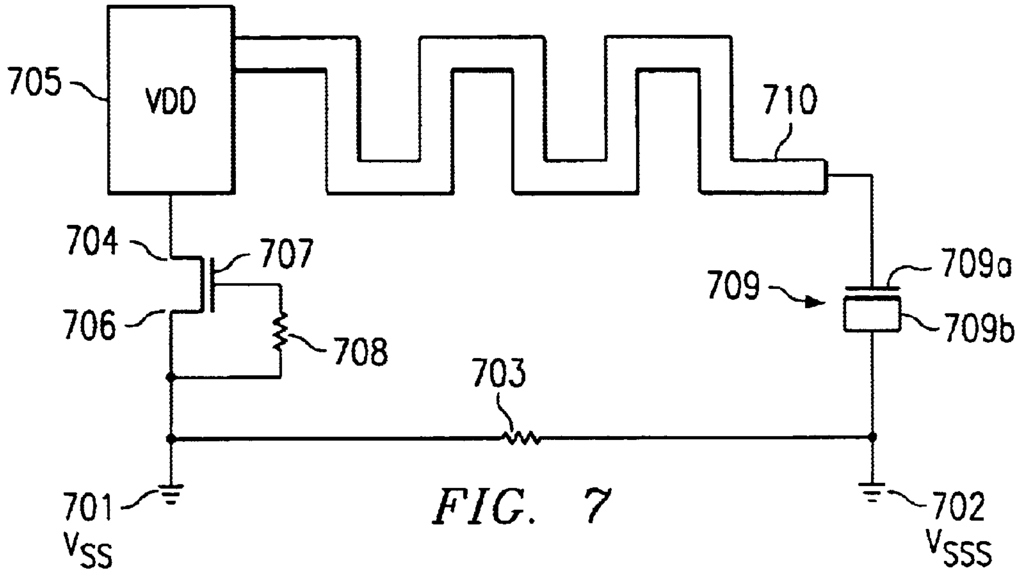
FIG. 7 is a schematic diagram of a noise-decoupling capacitor on a power pad of an integrated circuit, combined with an ESD protection transistor according to the third embodiment of the invention.

When the ground connection of the decoupling capacitor is desired to be separate from the ground potential of the ESD protection device, a small inductance can be built into the gate connection of the capacitor, as illustrated in FIG. 7, representing the third embodiment of the present invention. FIG. 7 shows two ground potentials, Vss, designated 701, and Vsss, designated 702. The ESD protection nMOS transistor has its drain 704 connected to power pad 705 (Vdd) and its source 706 connected to first ground potential 701. The gate 707 of the protection transistor is connected to first ground potential 701 through a first resistor 708. FIG. 7 further shows the component sensitive to ESD, namely a noise-decoupling capacitor 709, which has a thin insulator, for example a thin oxide layer. One capacitor gate 709*a* is connected to pad 705 through inductance 710, the other gate is connected to second ground potential 702. First ground potential 701 and second ground potential 702 are separated by substrate and bus resistor 703, or can be isolated by diodes. This layout can also be integrated.

With the different ground potentials 701 and 702, the nMOS protection device may not be as efficient to protect the capacitor gate 709*a*. The small inductor 710 would slow down the rise time of the ESD event pulse at the capacitor gate 709*a* to give sufficient time for the protection nMOS transistor to clamp.

Figure 8:
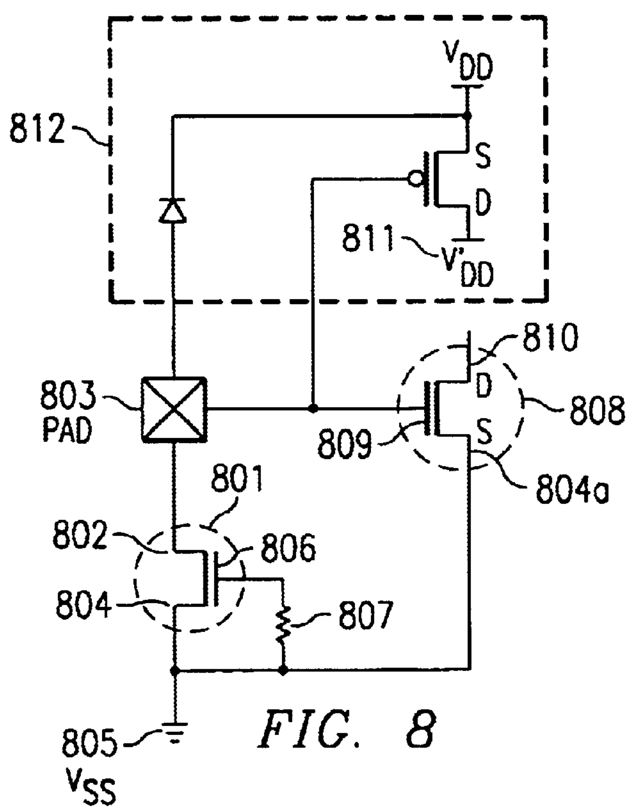
FIG. 8 is a schematic diagram of an input buffer on a power pad of an integrated circuit, combined with an ESD protection transistor according to the fourth embodiment of the invention.
Figure 9:
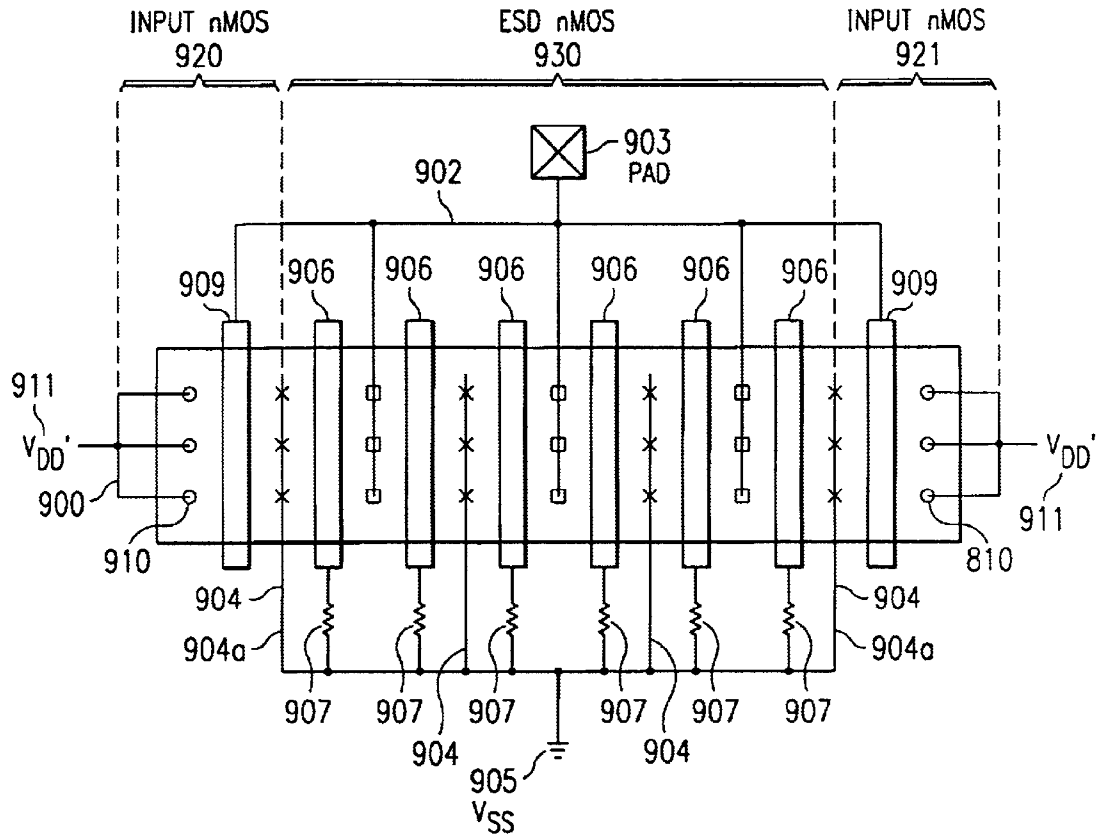
FIG. 9 shows a simplified top view of an input buffer formed as an nMOS transistor interdigitated with an ESD protection transistor in the face of an IC substrate, according to the fourth embodiment of the invention.
Figure 10:
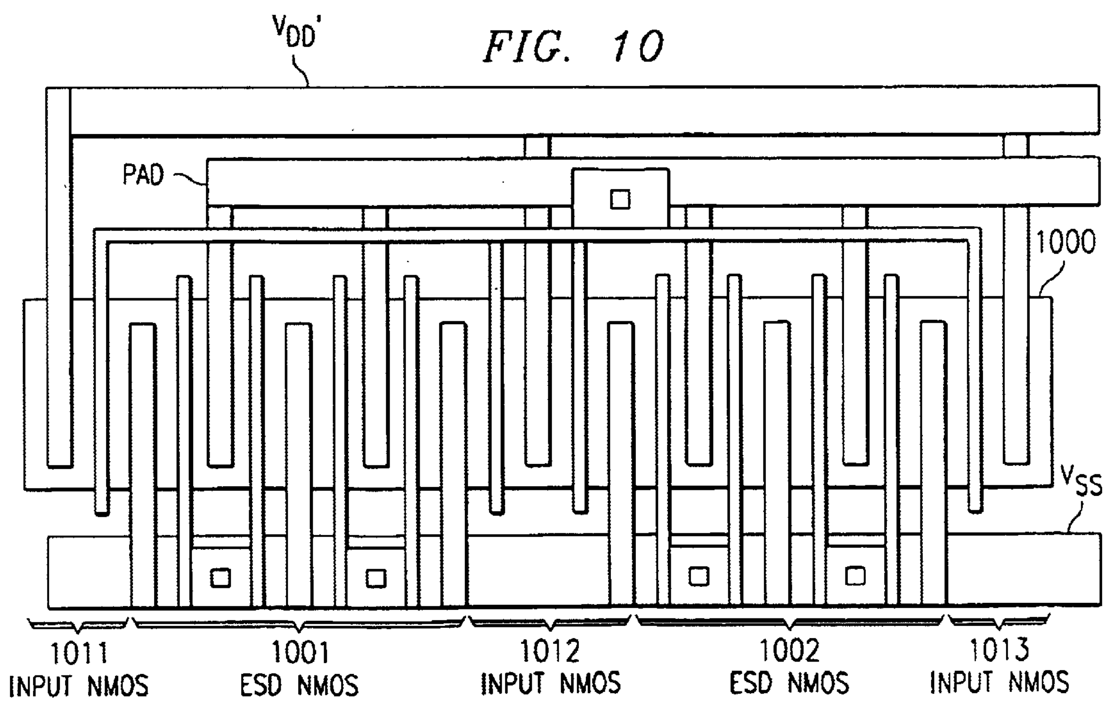
FIG. 10 shows a simplified top view of another input buffer formed as an nMOS transistor interdigitated with an ESD protection transistor in the face of an IC substrate, according to the fourth embodiment of the invention.

FIGS. 8, 9, and 10 illustrate the fourth embodiment of the invention. The concept of integrating a sensitive component with the protection device is applied to the protection of an input buffer without the need of an isolation resistor. This application thus provides for a fast circuit without the degradation of the input transient speed by any isolation resistor.

In the schematic circuit diagram of FIG. 8, the ESD protection device 801 is depicted as an nMOS transistor, its drain 802 connected to a power pad 803 and its source 804 connected to ground potential (Vss) 805. The gate 806 of the protection transistor is connected to ground potential 805 through a resistor 807. FIG. 8 further shows the component sensitive to ESD, namely an input buffer 808, which is another nMOS transistor with a thin oxide layer. For practical purposes, the source 804*a* of this input nMOS transistor is chosen to be identical to one of the sources 804 of the protection NMOS transistor, and is connected to ground potential 805. The gate 809 of the input transistor is connected to pad 803. The drain 810 is connected to the output Vdd' of the input buffer, designated 811.

In known fashion, the output of the input buffer is connected through a pMOS pull-up input buffer 812 to Vdd.

Without displaying the pMOS pull-up input buffer for simplicity, FIG. 9 illustrates more detail of the distributed and interdigitated arrangement of the components summarized in FIG. 8. FIG. 9 also emphasizes the elongated shape of many components as the preferred geometry for interdigitated arrangement. The moat is designated 900. Within the moat are located in interdigitated fashion:

the protection nMOS transistor with the components source 904, drain 902, and gate 906; and the input buffer nMOS transistor with the components source 904*a*, drain 910, and gate 909.

Outside the moat are pad 903, ground 905, output of the input buffer 911, and resistors 907.

FIG. 9 summarizes the integration of the input buffer with the protection transistor by interdigitated arrangement. The input nMOS regions are designated 920 and 921, and the protection nMOS regions by 930.

The input buffer gates and the protection nMOS gates can be varied in any sequence and proportion. For the purpose of integration, protection devices as well as ESD-sensitive devices are broken up into sections, without changing their sizes. The schematic top view of FIG. 10 illustrates a more extensive progression than the portion of FIG. 9 of the nMOS transistor of an input buffer and of an ESD protection nMOS transistor, integrated according to the fourth embodiment of the present invention in the moat 1000. The arrangements of the ESD protection nMOS transistors are indicated by regions 1001 and 1002. The arrangements of input buffer, formed as an nMOS transistor and interdigitated with the protection nMOS transistors, are indicated by 1011, 1012, and 1013. The elongated geometries and the electrical connections are equivalent to the interconnections in FIG. 9. The resistors between gates and Vss (ground potential) are not shown.

It should be stressed that analogous considerations hold for an n-well/substrate and pMOS transistors; the doping types and the electrical connotations are reversed.

Figure 11:
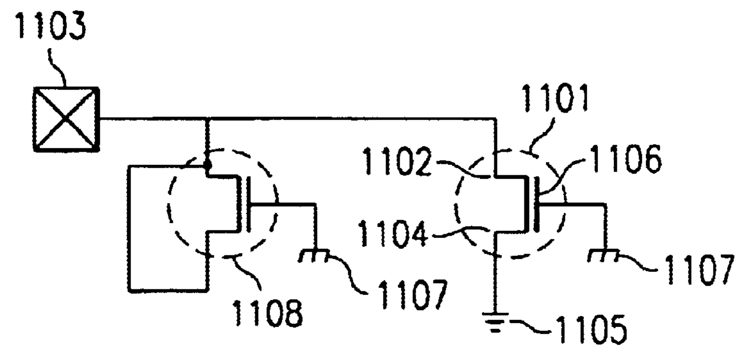
FIG. 11 is a schematic diagram of an antenna, tied to a power pad of an integrated circuit, combined with an ESD protection transistor according to the fifth embodiment of the invention.

The concept of integrating the ESD protection device with the device-to-be-protected can be extended the case of integrating an antenna diode with the ESD nMOS transistor. This fifth embodiment of the invention is illustrated in FIG. 11. The ESD protection device 1101 is depicted as an nMOS transistor, its drain 1102 connected to a power pad 1103 and its source 1104 connected to ground potential 1105. The gate 1106 of the protection transistor is connected to the substrate 1107. FIG. 11 further shows the component sensitive to ESD, namely an antenna 1108, which is designed as an MOS transistor with a thin insulator, for example a thin oxide layer. Source and drain of this antenna transistor as coupled together and tied to the pad 1103. The gate of this antenna transistor is connected to substrate 1107.

Figure 12:
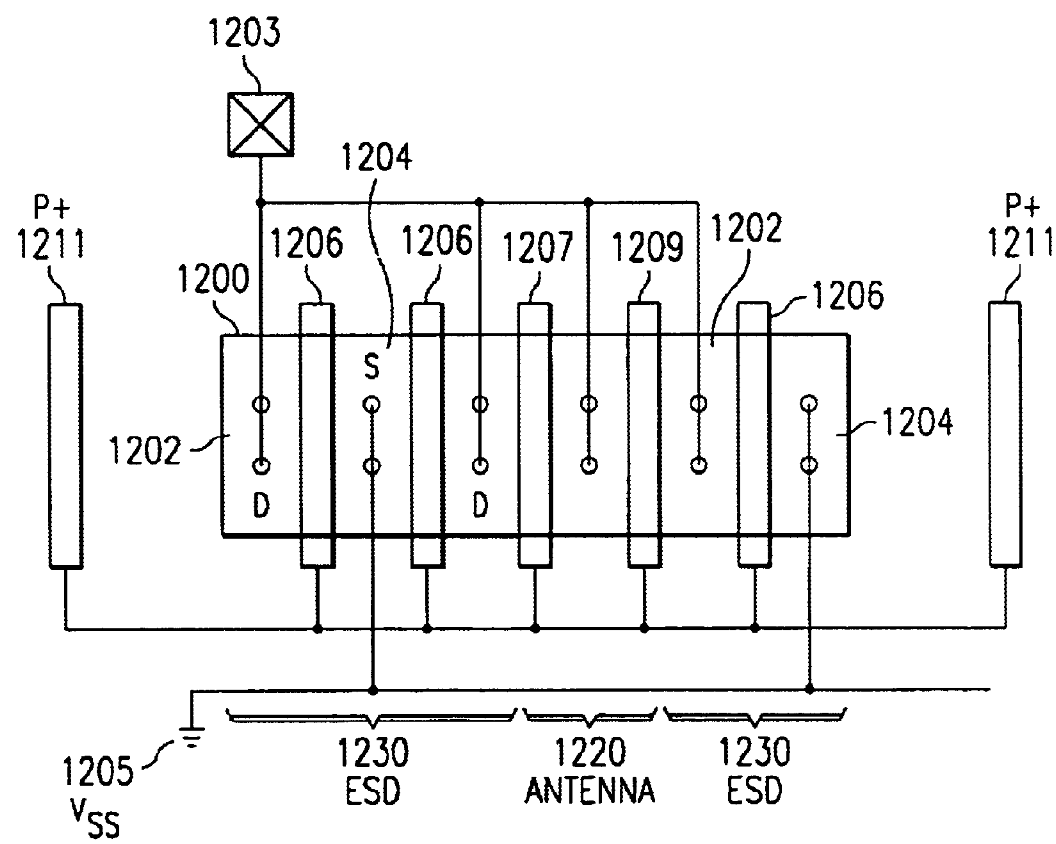
FIG. 12 shows a simplified top view of an antenna as an nMOS transistor interdigitated with an ESD protection transistor in the face of an IC substrate, according to the fifth embodiment of the invention.

In order to stress the integration aspect of the invention, FIG. 12 illustrates more detail of the distributed and interdigitated arrangement of the components summarized in FIG. 11. FIG. 12 also emphasizes the elongated shape of many components as the preferred geometry for interdigitated arrangement. The moat is designated 1200. Within the moat are located in interdigitated fashion:

the protection nMOS transistors with the components source 1204, drain 1202, and gate 1206; and the antenna nMOS transistor with the components source 1207, drain 1202, and gate 1209.

Outside the moat are pad 1203, ground 1205, and p-substrate p+ contacts 1211.

FIG. 9 summarizes the integration of the antenna with the protection transistor by interdigitated arrangement. The antenna nMOS region is designated 1220 and the protection nMOS regions by 1230. The antenna gates and the protection nMOS gates can be varies in any sequence and proportion. For the purpose of protection, protection devices as well as ESD-sensitive devices are broken up into sections, without changing their sizes.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. For instance, while the preferred semiconductor is silicon, the invention also applies to other semiconductor types such as silicon germanium, gallium arsenide, or any other semiconductor material employed in IC fabrication. As another example, while the preferred thin insulator is silicon dioxide, the invention also applies to any other inorganic or organic insulator, such as silicon oxynitride, silicon carbide, polyimide, or stacks of inorganic or organic layers. It is therefore intended that the appended claims encompass any such modifications or embodiments.

I claim:

1. An electrostatic discharge protection device formed at a face of a semiconductor substrate, integrated with a component sensitive to electrostatic discharge, wherein said protection device is interdigitated with said component; and wherein said component is either an input buffer without an isolation resistor, or a capacitor having a thin insulator comprising silicon oxide.

2. The device according to claim 1 wherein said interdigitation is configured in one or more planes.

3. The device according to claim 1 wherein said protection devices lie in a single plane spaced apart from the plane defined by said components.

4. The device according to claim 1 wherein said protection device is further partially merged with said component.

5. An electrostatic discharge protection device formed at a face of a semiconductor substrate having at least one p-well, comprising:

an nMOS protection transistor, its drain connected to a power pad and its source connected to ground potential, said protection transistor located in said p-well and having at least one gate, said gate connected to ground potential through a resistor;

a noise-decoupling, thin insulator capacitor connected to said pad and to ground potential in parallel with said protection transistor;

said capacitor formed as an nMOS transistor also located in said p-well and having at least one gate, said gate tied to said pad, and its source and drain shorted to ground potential, said capacitor interdigitated with said protection transistor, whereby said capacitor is integrated with said protection transistor so that said thin capacitor insulator is protected against damage.

6. The device according to claim 5 wherein said substrate is a p-type semiconductor.

7. The device according to claim 5 wherein said MOS transistor is an nMOS transistor.

8. The device according to claim 5 wherein said capacitor insulator is silicon dioxide.

9. The device according to claim 5 wherein said capacitor insulator is in the thickness range from about 0.5 to 10 nm.

10. An electrostatic discharge protection device formed at a face of a semiconductor substrate having at least one p-well, comprising:

an nMOS protection transistor, its drain connected to a power pad and its source connected to ground potential, said protection transistor located in said p-well and having at least one gate, said gate connected to ground potential through a resistor;

a noise-decoupling, thin insulator capacitor connected to said pad and to ground potential in parallel with said protection transistor;

said capacitor formed as an nMOS transistor located in an n-well nested in said p-well and having at least one gate, said gate tied to said pad, and its source and drain shorted to ground potential, said capacitor interdigitated with said protection transistor, whereby said capacitor is integrated with said protection transistor so that said thin capacitor insulator is protected against damage.

11. An electrostatic discharge protection device formed at a face of a semiconductor device having at least one p-well, comprising:

an nMOS protection transistor, its drain connected to a power pad and its source connected to a first ground potential, said protection transistor located in said p-well and having at least one gate, said gate connected to said first ground potential through a first resistor;

a noise-decoupling, thin insulator capacitor in parallel with said protection transistor, said capacitor connected to said pad and to a second ground potential, said second ground potential connected to said first ground potential through a second resistor;

said connection to said pad includes an inductance;

said capacitor formed as an nMOS transistor also located in said p-well and having at least one gate, said gate tied to said pad, through said inductance, and its source and drain shorted to said second ground potential, said capacitor interdigitated with said protection transistor, whereby said capacitor is integrated with said protection transistor and said thin capacitor insulator is protected against damage;

said protection provided by said inductance slowing the rise time of an ESD pulse at said capacitor gate to give sufficient time for said protection nMOS transistor to clamp.

12. The device according to claim 11 wherein said substrate is a p-type semiconductor.

13. The device according to 11 wherein said MOS transistor is an nMOS transistor.

14. An electrostatic discharge protection device formed at a face of a semiconductor substrate having at least one p-well, comprising:

an nMOS protection transistor, its drain connected to an input pad and its source connected to ground potential, said protection transistor located in said p-well and having at least one gate, said gate connected to ground potential through a resistor;

an input buffer formed as an nMOS transistor having its gate tied to said input pad without the need of an isolation resistor, its source connected to ground potential, and its drain to a pMOS pull-up input buffer tied to a power pad;

said input nMOS is also located in said p-well, interdigitated with said nMOS protection transistor, whereby said input buffer is integrated with said nMOS protection transistor so that said input buffer is protected against ESD damage.

15. An electrostatic discharge protection device formed at a face of a semiconductor substrate, comprising:

an MOS protection transistor, its drain connected to a power pad and its source connected to ground potential, said protection transistor having at least one gate, said gate connected to said substrate;

an antenna formed as a transistor having its source and drain connected to said power pad arid its gate tied to said substrate, whereby said antenna is integrated with said protection transistor so that said antenna is protected against ESD damage.

16. The device according to claim 15 wherein said substrate is a p-type semiconductor.

* * * * *